(12) United States Patent
Feng et al.

(10) Patent No.: US 10,262,749 B2
(45) Date of Patent: Apr. 16, 2019

(54) SHIFT REGISTER UNIT AND DRIVING METHOD, SHIFT REGISTER, GATE DRIVING CIRCUIT AND DISPLAY DEVICE

(71) Applicants: Boe Technology Group Co., Ltd., Beijing (CN); Beijing Boe Display Technology Co., Ltd., Beijing (CN)

(72) Inventors: Bin Feng, Beijing (CN); Junwei Wang, Beijing (CN); Ming Tian, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 103 days.

(21) Appl. No.: 15/512,639

(22) PCT Filed: Oct. 14, 2016

(86) PCT No.: PCT/CN2016/102130
§ 371 (c)(1),
(2) Date: Mar. 20, 2017

(87) PCT Pub. No.: WO2017/128772
PCT Pub. Date: Aug. 3, 2017

(65) Prior Publication Data
US 2018/0233208 A1 Aug. 16, 2018

(30) Foreign Application Priority Data
Jan. 29, 2016 (CN) .......................... 2016 1 0065078

(51) Int. Cl.
*G11C 19/00* (2006.01)
*G11C 19/28* (2006.01)
(Continued)

(52) U.S. Cl.
CPC ............... *G11C 19/28* (2013.01); *G09G 3/20* (2013.01); *G09G 3/3677* (2013.01); *G09G 2310/0286* (2013.01); *G09G 2310/08* (2013.01)

(58) Field of Classification Search
None
See application file for complete search history.

(56) References Cited

U.S. PATENT DOCUMENTS 8,040,999 B2 * 10/2011 Tobita .................... G11C 19/28
377/64
2006/0187177 A1 8/2006 Kuo et al.
(Continued)

FOREIGN PATENT DOCUMENTS

CN 102024415 A 4/2011
CN 102044304 A 5/2011
(Continued)

OTHER PUBLICATIONS

First Office Action for Chinese Patent Application No. 201610065078.0 dated Sep. 18, 2017.
(Continued)

*Primary Examiner* — Tuan T Lam
(74) *Attorney, Agent, or Firm* — Calfee, Halter & Griswold LLP

(57) ABSTRACT

A shift register unit comprises a pull-up module, a clock signal input terminal, a storage module, a signal output terminal, a control voltage signal input terminal and a current leakage suppression module. An output terminal of the current leakage suppression module is connected to a control terminal of the pull-up module A first input terminal of the current leakage suppression module is connected to the control voltage signal input terminal A second input terminal of the current leakage suppression module is connected to the other end of the storage module. A driving
(Continued)

method uses a shift register unit, a shift register, a gate driving circuit, and a display device.

20 Claims, 2 Drawing Sheets

(51) Int. Cl.
   *G09G 3/20* (2006.01)
   *G09G 3/36* (2006.01)

(56) References Cited

U.S. PATENT DOCUMENTS

| | | | | |
|---|---|---|---|---|
| 2007/0248204 | A1* | 10/2007 | Tobita | G11C 19/28 377/64 |
| 2011/0134090 | A1 | 6/2011 | Iwamoto et al. | |
| 2011/0142191 | A1* | 6/2011 | Tobita | G11C 19/184 377/64 |
| 2014/0191937 | A1* | 7/2014 | Xu | G09G 3/3648 345/99 |
| 2017/0345517 | A1* | 11/2017 | Wang | G11C 19/28 |
| 2018/0082629 | A1* | 3/2018 | Wang | G09G 3/2092 |
| 2018/0108289 | A1* | 4/2018 | Zheng | G09G 3/2092 |

FOREIGN PATENT DOCUMENTS

| | | |
|---|---|---|
| CN | 102132356 A | 7/2011 |
| CN | 103021360 | 4/2013 |
| CN | 103474038 | 12/2013 |
| CN | 104021769 | 9/2014 |
| CN | 104167192 | 11/2014 |
| CN | 105427793 | 3/2016 |
| CN | 105427793 A | 3/2016 |
| CN | 105489156 | 4/2016 |
| KR | 20140064045 A | 5/2014 |
| KR | 20140076851 A | 6/2014 |

OTHER PUBLICATIONS

Second Office Action for Chinese Patent Application No. 201610065078.0 dated May 21, 2018.
International Search Report for PCT/CN2016/102130 dated Dec. 29, 2016.

* cited by examiner

SHIFT REGISTER UNIT AND DRIVING METHOD, SHIFT REGISTER, GATE DRIVING CIRCUIT AND DISPLAY DEVICE

RELATED APPLICATIONS

The present application is the U.S. national phase entry of PCT/CN2016/102130, with an international filing date of Oct. 14, 2016, which claims the benefit of Chinese Patent Applications No. 201610065078.0, filed on Jan. 29, 2016, the entire disclosures of which are incorporated herein by reference.

FIELD

The present disclosure relates to the field of display devices, and particularly to a shift register unit, a driving method of the shift register unit, a shift register comprising the shift register unit, a gate driving circuit comprising the shift register and a display device comprising the gate driving circuit.

BACKGROUND

What is illustrated in FIG. 1 is a portion of a shift register unit. As shown in the figure, the shift register unit comprises a pull-up transistor T1, a storage capacitor C, a clock signal input terminal CLK, and a signal output terminal OUT. In an output phase of the shift register unit, the pull-up transistor T1 is turned on, such that a valid signal inputted via the clock signal input terminal CLK is outputted to the signal output terminal OUT. It is required to control the pull-up transistor T1 to be cut off in certain phases of the work cycle of the shift register unit (e.g. a reset phase of the shift register unit) so as to avoid output from the signal output terminal in these phases, thus it is necessary to make the voltage difference between the gate and the source of the pull-up transistor T1 to be zero.

However, as the display device is used, there exists a situation where the pull-up transistor T1 cannot be normally cut off, resulting in abnormal display.

SUMMARY

It is an object of the present disclosure to provide a shift register unit, a driving method of the shift register unit, a shift register comprising the shift register unit, a gate driving circuit comprising the shift register, and a display device comprising the gate driving circuit, thereby at least alleviating or even eliminating the deficiencies of the prior art as mentioned above.

In order to achieve the above object, as an aspect of the present disclosure, there is provided a shift register unit. The shift register unit comprises a pull-up module, a clock signal input terminal, a storage module and a signal output terminal. An input terminal of the pull-up module is electrically connected to the clock signal input terminal, an output terminal of the pull-up module is electrically connected to the signal output terminal, and one end of the storage module is electrically connected to the signal output terminal. The shift register unit further comprises a control voltage signal input terminal and a current leakage suppression module. An output terminal of the current leakage suppression module is connected to a control terminal of the pull-up module, a first input terminal of the current leakage suppression module is connected to the control voltage signal input terminal, and a second input terminal of the current leakage suppression module is connected to the other end of the storage module. The current leakage suppression module is configured to selectively make the output terminal of the current leakage suppression module in conduction with the first input terminal or the second input terminal of the current leakage suppression module under the control of a voltage signal inputted at the control terminal of the current leakage suppression module, and to disconnect the input terminal of the pull-up module from the output terminal of the pull-up module when the output terminal of the current leakage suppression module is in conduction with the first input terminal of the current leakage suppression module, and make the input terminal of the pull-up module in conduction with the output terminal of the pull-up module when the output terminal of the current leakage suppression module is in conduction with the second input terminal of the current leakage suppression module.

According to some embodiments, the pull-up module is configured to make the input terminal of the pull-up module in conduction with the output terminal of the pull-up module when an absolute value of a voltage difference between a voltage received by the control terminal of the pull-up module and a voltage received by the input terminal of the pull-up module is not greater than a preset value.

According to some embodiments, the control terminal of the current leakage suppression module is formed integrally with the second input terminal of the current leakage suppression module and is connected to the other end of the storage module.

As used herein, "the control terminal of the current leakage suppression module is formed integrally with the second input terminal of the current leakage suppression module" may indicate that the same one terminal of the current leakage suppression module is multiplexed as the control terminal and the second input terminal, and may also indicate that the control terminal and the second input terminal of the current leakage suppression module are inputted with the same signal and connected to the same terminal (i.e. the other end of the storage module).

According to some embodiments, the current leakage suppression module comprises a first switching element and a second switching element.

A control terminal of the first switching element is connected to the control terminal of the current leakage suppression module, an input terminal of the first switching element is connected to the first input terminal of the current leakage suppression module, and an output terminal of the first switching element is connected to the output terminal of the current leakage suppression module. The first switching element is configured to make the input terminal of the first switching element in conduction with the output terminal of the first switching element when the control terminal of the current leakage suppression module receives an invalid voltage signal.

As used herein, the term "invalid voltage signal" refers to a signal that is capable of disconnecting the input terminal of the pull-up module from the output terminal of the pull-up module. In contrast, the term "valid voltage signal" refers to a signal that is capable of making the input terminal of the pull-up module in conduction with the output terminal of the pull-up module.

An input terminal of the second switching element is connected to the control terminal of the current leakage suppression module, and an output terminal of the second switching element is connected to the output terminal of the current leakage suppression module. The second switching element is configured to make the input terminal of the second switching element in conduction with the output terminal of the second switching element when the control terminal of the current leakage suppression module receives a valid voltage signal.

According to some embodiments, the first switching element comprises a first transistor. A control terminal of the first transistor acts as the control terminal of the first switching element, a first terminal of the first transistor acts as the input terminal of the first switching element, and a second terminal of the first transistor acts as the output terminal of the first switching element.

According to some embodiments, the second switching element comprises a second transistor. A control terminal of the second transistor is connected to a first terminal of the second transistor and acts as the input terminal of the second switching element, and a second terminal of the second transistor acts as the output terminal of the second switching element.

According to some embodiments, the first transistor is a P-type transistor, and the second transistor is an N-type transistor.

According to some embodiments, the first transistor is an N-type transistor, and the second transistor is a P-type transistor.

According to some embodiments, the pull-up module comprises a pull-up transistor. A control terminal of the pull-up transistor acts as the control terminal of the pull-up module, a first terminal of the pull-up transistor acts as the input terminal of the pull-up module, and a second terminal of the pull-up transistor acts as the output terminal of the pull-up module.

According to some embodiments, the pull-up transistor is an N-type transistor.

According to some embodiments, the storage module comprises a storage capacitor.

As another aspect of the present disclosure, there is provided a shift register comprising multiple stages of cascaded shift register units, wherein the shift register unit is any of the above-described shift register units provided by the present disclosure.

As a further aspect of the present disclosure, there is provided a gate driving circuit comprising a shift register, wherein the shift register is the above-described shift register provided by the present disclosure.

As yet another aspect of the present disclosure, there is provided a display device comprising a gate driving circuit, wherein the gate driving circuit is the above-described gate driving circuit provided by the present disclosure.

As a further aspect of the present disclosure, there is provided a driving method of a shift register unit, wherein the shift register unit is any of the above-described shift register units provided by the present disclosure. Each work cycle of the driving method comprises:

in a charging phase, providing a first voltage signal to the clock signal input terminal, providing a control voltage signal to the control voltage signal input terminal, and providing a valid voltage signal to the control terminal of the current leakage suppression module;

in an output phase, providing a second voltage signal to the clock signal input terminal, providing a control voltage signal to the control voltage signal input terminal, and providing a valid voltage signal to the control terminal of the current leakage suppression module;

in an output pull-down phase, providing a first voltage signal to the clock signal input terminal, providing a control voltage signal to the control voltage signal input terminal, and providing an invalid voltage signal to the control terminal of the current leakage suppression module.

A polarity of the control voltage signal is the same as a polarity of the first voltage signal, and an absolute value of the control voltage signal is greater than an absolute value of the first voltage signal.

According to some embodiments, when the pull-up module comprises the pull-up transistor, and the pull-up transistor is an N-type transistor, the first voltage signal is −8V, and the control voltage signal inputted via the control voltage signal input terminal is −12~−16V.

When the shift register unit provided by the present disclosure is operating, in the output pull-down phase, the control voltage signal inputted via the control voltage signal input terminal can be provided to the control terminal of the pull-up module by the current leakage suppression module, and the control voltage signal input terminal inputs a control voltage signal that ensures turn-off of the pull-up module, which can consequently ensure that the input terminal of the pull-up module is disconnected from the signal output terminal so as to prevent generation of a leakage current.

BRIEF DESCRIPTION OF DRAWINGS

The accompanying drawings are used to provide a further understanding of the present disclosure and constitute a part of the specification for interpreting the present disclosure together with the specific embodiments below, but should not be construed as limiting the present disclosure. In the drawings.

DETAILED DESCRIPTION

Specific embodiments of the present disclosure will be described in detail below with reference to the accompanying drawings. It is to be understood that the specific embodiments described herein are only for the purpose of illustrating and explaining the present disclosure, rather than limiting it.

Figure 1:
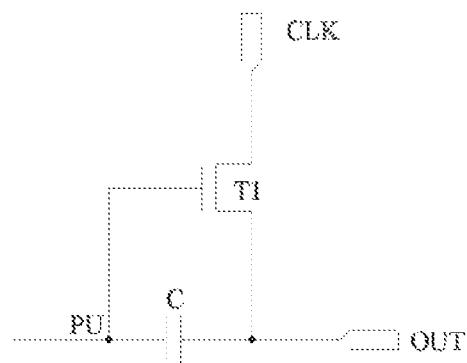
FIG. 1 is a schematic view of a portion of an existing shift register unit.
Figure 2:
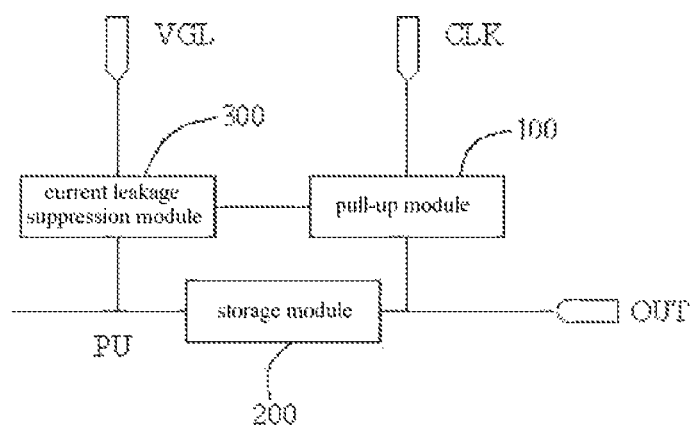
FIG. 2 is a schematic view of a portion of a shift register unit provided by embodiments of the present disclosure.

As an aspect of the present disclosure, there is provided a shift register unit. As shown in FIG. 2, the shift register unit comprises a pull-up module 100, a clock signal input terminal CLK, a storage module 200, and a signal output terminal OUT. An input terminal of the pull-up module 100 is electrically connected to the clock signal input terminal CLK, an output terminal of the pull-up module 100 is electrically connected to the signal output terminal OUT, and one end of the storage module 100 is electrically connected to the signal output terminal OUT. The shift register unit further comprises a control voltage signal input terminal VGL and a current leakage suppression module 300. An output terminal of the current leakage suppression module 300 is connected to a control terminal of the pull-up module 100, a first input terminal of the current leakage suppression module 300 is connected to the control voltage signal input terminal VGL, and a second input terminal of the current leakage suppression module 300 is connected to the other end of the storage module 200. The current leakage suppression module 300 is configured to selectively make the output terminal of the current leakage suppression module 300 in conduction with the first input terminal or the second input terminal of the current leakage suppression module 300 under the control of the voltage signal received by the control terminal of the current leakage suppression module 300. The current leakage suppression module 300 is further configured to disconnect the input terminal of the pull-up module from the output terminal of the pull-up module when the output terminal of the current leakage suppression module is in conduction with the first input terminal of the current leakage suppression module, and make the input terminal of the pull-up module in conduction with the output terminal of the pull-up module when the output terminal of the current leakage suppression module is in conduction with the second input terminal of the current leakage suppression module.

In some embodiments, when the voltage difference between the voltage received by the control terminal of the pull-up module 100 and the voltage received by the input terminal of the pull-up module 100 is not greater than a preset value, the input terminal of the pull-up module 100 is in conduction with the output terminal of the pull-up module 100.

When the shift register unit provided by embodiments of the present disclosure is used in a display device, a control voltage signal is provided to the control voltage signal input terminal VGL. Moreover, the other end of the storage module 200 acts as a pull-up node PU of the shift register unit.

When the first input terminal of the current leakage suppression module 300 is in conduction with the output terminal of the current leakage suppression module 300, the control voltage signal input terminal VGL is in conduction with the control terminal of the pull-up module 100. At that time, an invalid voltage signal can be inputted via the control voltage signal input terminal VGL so as to disconnect the input terminal of the pull-up module 100 from the output terminal of the pull-up module 100.

When the second input terminal of the current leakage suppression module 300 is in conduction with the output terminal of the current leakage suppression module 300, the pull-up node PU is in conduction with the control terminal of the pull-up module 100. If the electrical level of the pull-up node PU is sufficiently high, the input terminal of the pull-up module 100 can be in conduction with the output terminal of the pull-up module 100.

By controlling the time for which the first input terminal of the current leakage suppression module 300 is in conduction with the output terminal of the current leakage suppression module 300, and designing the magnitude of the control voltage signal inputted by the control voltage signal input terminal VGL, control of the voltage received by the control terminal of the pull-up module 100 can be realized, thereby controlling turn-on and turn-off of the pull-up module 100.

Figure 4:
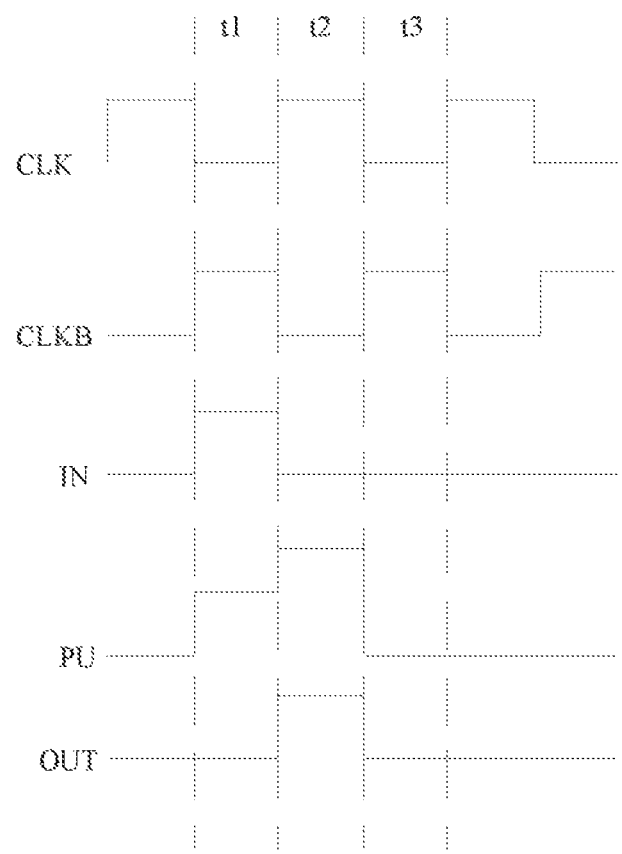
FIG. 4 is a timing diagram of the respective signals when the shift register unit provided by embodiments of the present disclosure is operating.

When the shift register unit provided by embodiments of the present disclosure is used in a display device, the work cycle of the shift register unit provided by embodiments of the present disclosure is described in detail with reference to the signal timing diagram in FIG. 4.

When the shift register unit is operating, a control voltage signal is inputted to the control voltage signal input terminal VGL. The polarity of the control voltage signal is the same as the polarity of an invalid clock signal and the absolute value of the control voltage signal is greater than the absolute value of the invalid clock signal.

It is easy to understand that the shift register unit comprises a signal input terminal. In FIG. 4, the signal timing diagram represented by IN is the timing of signals inputted via the signal input terminal.

In a charging phase t1, an invalid clock signal (herein referred to as a first voltage signal) is provided to the clock signal input terminal CLK. At that time, a valid voltage signal is stored in the storage module 200 via the signal input terminal IN so that the potential of the pull-up node PU is equal to the potential of the valid voltage signal. In this phase, a valid voltage signal can be provided to the control terminal of the current leakage suppression module 300 so that the second input terminal of the current leakage suppression module 300 is in conduction with the output terminal of the current leakage suppression module 300, that is, the pull-up node PU is in conduction with the control terminal of the pull-up module 100. Since the potential of the pull-up node PU at that time is equal to the potential of the valid voltage signal, the input terminal of the pull-up module 100 is in conduction with the output terminal of the pull-up module 100, so that the signal output terminal OUT outputs an invalid clock signal.

In the output phase t2, a valid clock signal (herein referred to as a second voltage signal) is inputted via the clock signal input terminal CLK, and the input terminal of the shift register unit is disconnected from the storage module 200. Under the bootstrap function of the storage module 200, the voltage at the pull-up node PU is still a valid voltage that is capable of making the input terminal of the pull-up module 100 in conduction with the output terminal of the pull-up module 100. In this phase, a valid signal is provided to the control terminal of the current leakage suppression module 300 so that the second input terminal of the current leakage suppression module 300 is in conduction with the output terminal of the current leakage suppression module 300. Thus, the control terminal of the pull-up module 100 is inputted with a valid voltage signal. At that time, the input terminal of the pull-up module 100 is in conduction with the signal output terminal OUT so that the signal output terminal OUT outputs a valid clock signal.

In the output pull-down phase t3, an invalid voltage signal can be provided to the control terminal of the current leakage suppression module 300 so that the first signal input terminal of the current leakage suppression module 300 is in conduction with the output terminal of the current leakage suppression module 300. Therefore, by controlling the control voltage signal inputted by the control voltage signal input terminal VGL to be inputted to the control terminal of the pull-up module 100, it can be ensured that the input terminal of the pull-up module 100 is disconnected from the output terminal of the pull-up module 100, which prevents occurrence of a leakage current between the input terminal of the pull-up module 100 and the output terminal of the pull-up module 100 that affects a normal output signal, thereby preventing emergence of abnormal display.

It can be seen that, when the shift register unit provided by embodiments of the present disclosure is operating, in the output pull-down phase, the control voltage signal inputted by the control voltage signal input terminal VGL can be provided to the control terminal of the pull-up module 100 via the current leakage suppression module 300, and the control voltage signal input terminal VGL inputs a control voltage signal that ensures turn-off of the pull-up module 100, which can consequently ensure that the input terminal of the pull-up module 100 is disconnected from the signal output terminal so as to prevent generation of a leakage current.

In the present disclosure, the current leakage suppression module 300 may take any suitable form. For example, as shown in FIG. 2, the control terminal of the current leakage suppression module 300 is formed integrally with the second input terminal of the current leakage suppression module 300 and is connected to the other end (i.e. the pull-up node PU) of the storage module 200.

Figure 3:
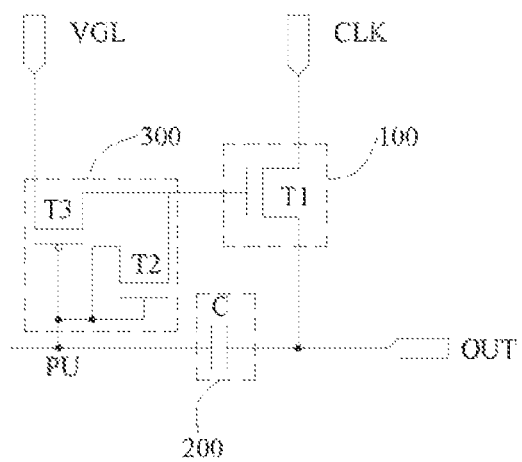
FIG. 3 is a schematic view of a portion of a shift register unit provided by embodiments of the present disclosure.

FIG. 3 illustrates a schematic view of a portion of a shift register unit according to embodiments of the present disclosure. As shown in FIG. 3, the current leakage suppression module 300 comprises a first switching element T3 and a second switching element T2.

The control terminal of the first switching element T3 is connected to the control terminal of the current leakage suppression module 300, the input terminal of the first switching element T3 is connected to the first input terminal of the current leakage suppression module 300, and the output terminal of the first switching element T3 is connected to the output terminal of the current leakage suppression module 300. The first switching element T3 is configured to make the input terminal of the first switching element T3 in conduction with the output terminal of the first switching element T3 when the control terminal of the current leakage suppression module 300 receives an invalid voltage signal.

The input terminal of the second switching element T2 is connected to the control terminal of the current leakage suppression module 300, and the output terminal of the second switching element T2 is connected to the output terminal of the current leakage suppression module 300. The second switching element T2 is configured to make the input terminal of the second switching element T2 in conduction with the output terminal of the second switching element T2 when the control terminal of the current leakage suppression module 300 receives a valid voltage signal.

When the valid voltage signal is received, the first switching element T3 is turned off and the second switching element T2 is turned on. When the invalid voltage signal is received, the first switching element T3 is turned on and the second switching element T2 is turned off.

In an exemplary embodiment, as shown in FIG. 3, the first switching element T3 comprises a first transistor. An control terminal of the first transistor acts as the control terminal of the first switching element, a first terminal of the first transistor acts as the input terminal of the first switching element T3, and a second terminal of the first transistor acts as the output terminal of the first switching element T3.

It is easy to understand that when the control terminal of the first switching element T3 receives a valid voltage signal, the input terminal of the first switching element T3 is disconnected from the output terminal of the first switching element T3. When the control terminal of the first switching element T3 receives an invalid voltage signal, the input terminal of the first switching element T3 is in conduction with the output terminal of the first switching element T3. For example, when the valid voltage signal is a high level signal, the first transistor may be a P-type transistor.

In the present disclosure, the second switching element T2 may take any suitable form. For example, the second switching element T2 may be a diode. When the valid voltage signal is a high level signal, the anode of the second switching element T2 is connected to the pull-up node PU, and the cathode of the second switching element T2 is connected to the control terminal of the pull-up module 100.

Alternatively, the second switching element T2 may comprise a second transistor. A control terminal of the second transistor is connected to a first terminal of the second transistor and acts as the input terminal of the second switching element T2, and a second terminal of the second transistor acts as the output terminal of the second switching element T2. The control terminal of the second transistor is connected to the first terminal of the second transistor, thereby forming into a diode connection.

It is easy to understand that when the control terminal of the second switching element T2 receives a valid voltage signal, the input terminal of the second switching element T2 is in conduction with the output terminal of the second switching element T2. When the control terminal of the second switching element T2 receives an invalid voltage signal, the input terminal of the second switching element T2 is disconnected from the output terminal of the second switching element T2. When the valid voltage signal is a high level signal, the second transistor may be an N-type transistor. When the valid voltage signal is a low level signal, the second transistor may be a P-type transistor.

It can be seen that when the first switching element T3 and the second switching element T2 both comprise transistors, the types of the transistors are not the same. If the first transistor is a P-type transistor, the second transistor is an N-type transistor. If the first transistor is an N-type transistor, the second transistor is a P-type transistor.

In the present disclosure, the pull-up module 100 may take any suitable form. For example, as shown in FIG. 3, the pull-up module 100 comprises a pull-up transistor T1. A control terminal of the pull-up transistor T1 acts as the control terminal of the pull-up module 100, a first terminal of the pull-up transistor T1 acts as the input terminal of the pull-up module 100, and a second terminal of the pull-up transistor T1 acts as the output terminal of the pull-up module 100.

As shown in FIG. 3, the control terminal of the pull-up transistor T1 is connected to the output terminal of the current leakage suppression module 300, the first terminal of the pull-up transistor T1 is connected to the clock signal input terminal CLK, and the second terminal of the pull-up transistor T1 is connected to the signal output terminal OUT.

When the pull-up transistor T1 is an N-type transistor, theoretically, when the voltage difference between the gate and the source of the pull-up transistor T1 (i.e. the voltage difference between the gate and the second terminal of the pull-up transistor T1) is 0, the pull-up transistor T1 is cut off. In order to avoid generation of a leakage current, the voltage at the control terminal of the pull-up transistor T1 can be set to a lower voltage so that the voltage difference between the gate and the source of the pull-up transistor T1 is smaller than 0, which can consequently ensure that the pull-up transistor T1 is cut off, thereby avoiding generation of a leakage current.

For example, when the low level voltage of the clock signal inputted via the clock signal input terminal CLK is −8V, a voltage of smaller than −8V can be provided to the control voltage signal input terminal VGL. For example, a voltage between −16V and −12V may be provided to the control voltage signal input terminal VGL to ensure that the pull-up transistor T1 can be cut off.

As an example implementation of the present disclosure, the pull-up transistor T1 is an N-type transistor. Correspondingly, the valid voltage signal is a high level signal and the invalid voltage signal is a low level signal. Correspondingly, the second transistor may be an N-type transistor, and the first transistor may be a P-type transistor.

In the present disclosure, the storage module 200 may take any suitable form, as long as it can store charges in the charging phase and ensure that the electrical level of the pull-up node PU is at the level of the valid voltage signal in the output phase. For example, the storage module 200 comprises a storage capacitor C. One end of the storage capacitor C acts as one end of the storage module 200, and the other end of the storage capacitor C acts as the other end of the storage module 200.

As another aspect of the present disclosure, there is provided a shift register. The shift register comprises multiple stages of cascaded shift register units, wherein the shift register unit is any of the above-described shift register units provided by the present disclosure.

As a further aspect of the present disclosure, there is provided a gate driving circuit comprising a shift register, wherein the shift register is the above-described shift register provided by the present disclosure.

As yet another aspect of the present disclosure, there is provided a display device comprising a gate driving circuit, wherein the gate driving circuit is the above-described gate driving circuit provided by the present disclosure.

Embodiments of the present disclosure further provide a driving method of a shift register unit, wherein the shift register unit is any of the above-described shift register units provided by the present disclosure. As shown in FIG. 4, each work cycle of the driving method comprises the following phases.

In a charging phase t1, a first voltage signal (i.e. invalid clock signal) is provided to the clock signal input terminal CLK, a control voltage signal is provided to the control voltage signal input terminal, and a valid voltage signal is provided to the control terminal of the current leakage suppression module.

In an output phase t2, a second voltage signal (i.e. valid clock signal) is provided to the clock signal input terminal CLK, a control voltage signal is provided to the control voltage signal input terminal, and a valid voltage signal is provided to the control terminal of the current leakage suppression module.

In an output pull-down phase t3, a first voltage signal is provided to the clock signal input terminal, a control voltage signal is provided to the control voltage signal input terminal, and an invalid voltage signal is provided to the control terminal of the current leakage suppression module.

The polarity of the control voltage signal is the same as the polarity of the first voltage signal, and the absolute value of the control voltage signal is greater than the absolute value of the first voltage signal.

The driving method provided by embodiments of the present disclosure is described below with reference to the specific circuit configuration in FIG. 3. As shown in FIG. 3, the current leakage suppression module 300 comprises a P-type first transistor T3 and an N-type second transistor T2. The control terminal of the current leakage suppression module 300 is formed integrally with the second input terminal of the current leakage suppression module 300 and is connected to the pull-up node PU. The pull-up module 100 comprises an N-type pull-up transistor T1, and the storage module 200 comprises a storage capacitor C.

In the charging phase t1, the first voltage signal is provided to the clock signal input terminal CLK and the storage capacitor C is charged via the signal input terminal IN so that the potential of the pull-up node PU is equal to the potential of the valid voltage signal. Therefore, the first transistor T3 is cut off and the second transistor T2 is turned on, which consequently makes the pull-up node PU in conduction with the control terminal of the pull-up transistor T1 so that the first terminal of the pull-up transistor T1 is in conduction with the second terminal of the pull-up transistor T1. Therefore, in the charging phase, the signal output terminal OUT outputs an invalid clock signal (i.e. first voltage signal).

In the output phase t2, an invalid voltage signal is provided to the storage capacitor C via the signal input terminal IN, and the second voltage signal is provided via the clock signal input terminal CLK. Therefore, the storage capacitor C exerts the bootstrap function to pull the potential of the pull-up node PU to a higher level. Therefore, the first transistor T3 is cut off and the second transistor T2 is turned on, which consequently makes the pull-up node PU in conduction with the control terminal of the pull-up transistor T1, so that the first terminal of the pull-up transistor T1 is in conduction with the second terminal of the pull-up transistor T1. Thus, in the output phase, the signal output terminal OUT outputs a valid clock signal (i.e. second voltage signal).

In the output pull-down phase t3, an invalid voltage signal is provided to the storage capacitor via the signal input terminal IN, and the first voltage signal is provided via the clock signal input terminal CLK. Since the storage capacitor C is discharged in the output phase t2, the potential of the pull-up node PU is the potential of the invalid voltage signal. At that time, the first transistor T3 is turned on and the second transistor T2 is cut off, such that the control voltage inputted by the control voltage signal input terminal VGL is provided to the control terminal of the pull-up transistor T1. Since the polarity of the control voltage signal VGL is the same as that of the invalid clock signal and the absolute value of the control voltage signal VGL is smaller than that of the invalid clock signal, the voltage of the control terminal of the pull-up transistor T1 is smaller than the voltage of the first terminal of the pull-up transistor, which can ensure that the pull-up transistor T1 is completely cut off in this phase, thereby avoiding generation of a leakage current.

It should be understood by those skilled in the art that in the shift register unit, there is a clock signal input terminal CLKB which is complementary in phase to the clock signal inputted by the clock signal input terminal CLK. It is known to those skilled in the art how to set the clock signal input terminal CLKB, which is not described here for simplicity.

In an exemplary embodiment, as described above, when the pull-up module comprises a pull-up transistor and the pull-up transistor is an N-type transistor, the invalid clock signal inputted via the clock signal input terminal is −8V, and the control voltage signal inputted via the control voltage signal input terminal is −12~−16V.

It can be understood that the above embodiments are exemplary embodiments used only for illustrating the principle of the present disclosure, and that the present disclosure is not so limited. Various variations and improvements may be made by those ordinarily skilled in the art without departing from the spirit and essence of the present disclosure. These variations and improvements are regarded as falling within the scope of the present disclosure.

The invention claimed is:

1. A shift register unit, comprising a pull-up module, a clock signal input terminal, a storage module, a signal output terminal, a control voltage signal input terminal and a current leakage suppression module,
wherein,
an input terminal of the pull-up module is electrically connected to the clock signal input terminal,
an output terminal of the pull-up module is electrically connected to the signal output terminal, one end of the storage module is electrically connected to the signal output terminal, an output terminal of the current leakage suppression module is connected to a control terminal of the pull-up module, a first input terminal of the current leakage suppression module is connected to the control voltage signal input terminal, and a second input terminal of the current leakage suppression module is connected to the other end of the storage module, wherein the current leakage suppression module is configured to selectively make the output terminal of the current leakage suppression module in conduction with the first input terminal or the second input terminal of the current leakage suppression module under the control of a voltage signal inputted at a control terminal of the current leakage suppression module, to disconnect the input terminal of the pull-up module from the output terminal of the pull-up module when the output terminal of the current leakage suppression module is in conduction with the first input terminal of the current leakage suppression module, and to make the input terminal of the pull-up module in conduction with the output terminal of the pull-up module when the output terminal of the current leakage suppression module is in conduction with the second input terminal of the current leakage suppression module.

2. The shift register unit according to claim 1, wherein the pull-up module is configured to make the input terminal of the pull-up module in conduction with the output terminal of the pull-up module when an absolute value of a voltage difference between a voltage received by the control terminal of the pull-up module and a voltage received by the input terminal of the pull-up module is not greater than a preset value.

3. The shift register unit according to claim 1, wherein the control terminal of the current leakage suppression module is formed integrally with the second input terminal of the current leakage suppression module and is connected to the other end of the storage module.

4. The shift register unit according to claim 3, wherein the current leakage suppression module comprises a first switching element and a second switching element, a control terminal of the first switching element being connected to the control terminal of the current leakage suppression module, an input terminal of the first switching element being connected to the first input terminal of the current leakage suppression module, and an output terminal of the first switching element being connected to the output terminal of the current leakage suppression module, the first switching element being configured to make the input terminal of the first switching element in conduction with the output terminal of the first switching element when the control terminal of the current leakage suppression module receives an invalid voltage signal;

an input terminal of the second switching element being connected to the control terminal of the current leakage suppression module, and an output terminal of the second switching element being connected to the output terminal of the current leakage suppression module, the second switching element being configured to make the input terminal of the second switching element in conduction with the output terminal of the second switching element when the control terminal of the current leakage suppression module receives a valid voltage signal.

5. The shift register unit according to claim 4, wherein the first switching element comprises a first transistor, a control terminal of the first transistor acting as the control terminal of the first switching element, a first terminal of the first transistor acting as the input terminal of the first switching element, and a second terminal of the first transistor acting as the output terminal of the first switching element.

6. The shift register unit according to claim 5, wherein the second switching element comprises a second transistor, a control terminal of the second transistor being connected to a first terminal of the second transistor and acting as the input terminal of the second switching element, and a second terminal of the second transistor acting as the output terminal of the second switching element.

7. The shift register unit according to claim 6, wherein the first transistor is a P-type transistor, and the second transistor is an N-type transistor.

8. The shift register unit according to claim 6, wherein the first transistor is an N-type transistor, and the second transistor is a P-type transistor.

9. The shift register unit according to claim 1, wherein the pull-up module comprises a pull-up transistor, a control terminal of the pull-up transistor acting as the control terminal of the pull-up module, a first terminal of the pull-up transistor acting as the input terminal of the pull-up module, and a second terminal of the pull-up transistor acting as the output terminal of the pull-up module.

10. The shift register unit according to claim 9, wherein the pull-up transistor is an N-type transistor.

11. The shift register unit according to claim 1, wherein the storage module comprises a storage capacitor.

12. A driving method of a shift register unit, wherein the shift register unit is a shift register unit according to claim 1, each work cycle of the driving method comprising:

in a charging phase, providing a first voltage signal to the clock signal input terminal, providing a control voltage signal to the control voltage signal input terminal, and providing a valid voltage signal to the control terminal of the current leakage suppression module;

in an output phase, providing a second voltage signal to the clock signal input terminal, providing a control voltage signal to the control voltage signal input terminal, and providing a valid voltage signal to the control terminal of the current leakage suppression module;

in an output pull-down phase, providing a first voltage signal to the clock signal input terminal, providing a control voltage signal to the control voltage signal input terminal, and providing an invalid voltage signal to the control terminal of the current leakage suppression module, wherein a polarity of the control voltage signal is the same as a polarity of the first voltage signal, and an absolute value of the control voltage signal is greater than an absolute value of the first voltage signal.

13. The driving method according to claim 12, wherein the pull-up module comprises a pull-up transistor, a control terminal of the pull-up transistor acting as the control terminal of the pull-up module, a first terminal of the pull-up transistor acting as the input terminal of the pull-up module, and a second terminal of the pull-up transistor acting as the output terminal of the pull-up module, the pull-up transistor being an N-type transistor, the first voltage signal being −8V, and the control voltage signal inputted via the control voltage signal input terminal being --12~--16V.

14. A shift register comprising multiple stages of cascaded shift register units, wherein the shift register unit comprises a pull-up module, a clock signal input terminal, a storage module, a signal output terminal, a control voltage signal input terminal and a current leakage suppression module,
wherein,
an input terminal of the pull-up module is electrically connected to the clock signal input terminal,
an output terminal of the pull-up module is electrically connected to the signal output terminal,
one end of the storage module is electrically connected to the signal output terminal,
an output terminal of the current leakage suppression module is connected to a control terminal of the pull-up module,
a first input terminal of the current leakage suppression module is connected to the control voltage signal input terminal, and
a second input terminal of the current leakage suppression module is connected to the other end of the storage module,
wherein the current leakage suppression module is configured to selectively make the output terminal of the current leakage suppression module in conduction with the first input terminal or the second input terminal of the current leakage suppression module under the control of a voltage signal inputted at a control terminal of the current leakage suppression module, to disconnect the input terminal of the pull-up module from the output terminal of the pull-up module when the output terminal of the current leakage suppression module is in conduction with the first input terminal of the current leakage suppression module, and to make the input terminal of the pull-up module in conduction with the output terminal of the pull-up module when the output terminal of the current leakage suppression module is in conduction with the second input terminal of the current leakage suppression module.

15. A gate driving circuit comprising a shift register, wherein the shift register is a shift register according to claim 14.

16. A display device comprising a gate driving circuit, wherein the gate driving circuit is a gate driving circuit according to claim 15.

17. The shift register according to claim 14, wherein the pull-up module is configured to make the input terminal of the pull-up module in conduction with the output terminal of the pull-up module when an absolute value of a voltage difference between a voltage received by the control terminal of the pull-up module and a voltage received by the input terminal of the pull-up module is not greater than a preset value.

18. The shift register according to claim 14, wherein the control terminal of the current leakage suppression module is formed integrally with the second input terminal of the current leakage suppression module and is connected to the other end of the storage module.

19. The shift register according to claim 18, wherein the current leakage suppression module comprises a first switching element and a second switching element,
control terminal of the first switching element being connected to the control terminal of the current leakage suppression module, an input terminal of the first switching element being connected to the first input terminal of the current leakage suppression module, and an output terminal of the first switching element being connected to the output terminal of the current leakage suppression module, the first switching element being configured to make the input terminal of the first switching element in conduction with the output terminal of the first switching element when the control terminal of the current leakage suppression module receives an invalid voltage signal;
an input terminal of the second switching element being connected to the control terminal of the current leakage suppression module, and an output terminal of the second switching element being connected to the output terminal of the current leakage suppression module,
the second switching element being configured to make the input terminal of the second switching element in conduction with the output terminal of the second switching element when the control terminal of the current leakage suppression module receives a valid voltage signal.

20. The shift register according to claim 19, wherein the first switching element comprises a first transistor, a control terminal of the first transistor acting as the control terminal of the first switching element, a first terminal of the first transistor acting as the input terminal of the first switching element, and a second terminal of the first transistor acting as the output terminal of the first switching element.

* * * * *